(12) United States Patent
Venugopal et al.

(10) Patent No.: US 11,418,173 B2
(45) Date of Patent: Aug. 16, 2022

(54) HYBRID PULSE/TWO-STAGE DATA LATCH

(71) Applicant: Apple Inc., Cupertino, CA (US)

(72) Inventors: Vivekanandan Venugopal, San Jose, CA (US); Raghava Rao V. Denduluri, Cupertino, CA (US); Ajay Bhatia, Saratoga, CA (US); Suparn Vats, Fremont, CA (US); Suresh Balasubramanian, Cupertino, CA (US); Gopinath Venkatesh, San Jose, CA (US); Teng Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/989,621

(22) Filed: Aug. 10, 2020

(65) Prior Publication Data

US 2020/0373915 A1 Nov. 26, 2020

Related U.S. Application Data

(63) Continuation of application No. 16/243,954, filed on Jan. 9, 2019, now Pat. No. 10,742,201.

(60) Provisional application No. 62/737,748, filed on Sep. 27, 2018.

(51) Int. Cl.
  *G06F 1/08* (2006.01)
  *H03K 3/037* (2006.01)
  *G06F 1/28* (2006.01)

(52) U.S. Cl.
  CPC ............. *H03K 3/0372* (2013.01); *G06F 1/08* (2013.01); *G06F 1/28* (2013.01)

(58) Field of Classification Search
  CPC ........ H03K 3/0372; H03K 3/012; G06F 1/28; G06F 1/08; G06F 1/3243; Y02D 10/00
  See application file for complete search history.

(56) References Cited

U.S. PATENT DOCUMENTS

| | | | |
|---|---|---|---|
| 6,279,090 B1 * | 8/2001 | Manning | G11C 7/22 713/400 |
| 6,696,829 B1 * | 2/2004 | Nguyen | H03L 7/0802 324/76.52 |
| 7,548,103 B2 | 6/2009 | Ramaraju et al. | |
| 8,305,126 B2 * | 11/2012 | Smith | H03K 3/0372 716/108 |
| 8,760,193 B2 | 6/2014 | Voogel et al. | |
| 8,786,344 B2 | 7/2014 | Salling | |
| 9,071,233 B2 | 6/2015 | Elkin et al. | |
| 10,410,699 B1 * | 9/2019 | Thaploo | G11C 7/222 |
| 2004/0041610 A1 | 3/2004 | Kundu | |
| 2006/0055653 A1 | 3/2006 | Matsumoto et al. | |
| 2007/0230266 A1 * | 10/2007 | Kao | G11C 7/1051 365/189.16 |
| 2017/0288670 A1 | 10/2017 | Kozuma et al. | |

* cited by examiner

*Primary Examiner* — Sibin Chen
(74) *Attorney, Agent, or Firm* — Kowert, Hood, Munyon, Rankin & Goetzel, P.C.; Scott W. Pape; Dean M. Munyon

(57) ABSTRACT

An apparatus includes a control circuit configured to selectively activate, based on an operating mode signal, either a local clock signal or a pulse signal. The apparatus further includes a data storage circuit that is coupled to a data signal, the local clock signal, and the pulse signal. The data storage circuit may be configured to sample the data signal using the local clock signal during a first operating mode, and to sample the data signal using the pulse signal during a second operating mode.

20 Claims, 9 Drawing Sheets

HYBRID PULSE/TWO-STAGE DATA LATCH

PRIORITY CLAIM

The present application is a continuation of U.S. application Ser. No. 16/243,954, filed Jan. 9, 2019 (now U.S. Pat. No. 10,742,201), which claims priority to U.S. Provisional Appl. No. 62/737,748, filed Sep. 27, 2018; the disclosures of each of the above-referenced applications are incorporated by reference herein in their entireties

BACKGROUND

Technical Field

Embodiments described herein are related to the field of integrated circuit implementation, and more particularly to the implementation of data storage circuits.

Description of the Related Art

Synchronous logic circuits, such as a processor circuit, may utilize data storage circuits, such as flip-flops and data latches, to control propagation of one or more data signals through the circuit. Various designs of data storage circuits are known, each with its own advantages and disadvantages. Some designs may capture, store, and propagate values of data signals with narrow setup and hold times, thereby allowing these designs to be used in high frequency circuits in which a data value may be valid for only a short time. Such data storage circuit designs however, may not work as well over a broad range of power supply voltage levels, as may be encountered in battery powered devices, such as laptop computers, smart phones, tablets, and wearable devices.

SUMMARY

Broadly speaking, various techniques are disclosed relating to embodiments of a data storage circuit. Systems and methods are contemplated in which an embodiment of an apparatus includes a control circuit configured to selectively activate, based on an operating mode signal, either a local clock signal or a pulse signal. The apparatus also includes a data storage circuit coupled to a data signal, the local clock signal, and the pulse signal. The data storage circuit is configured to sample the data signal using the local clock signal during a first operating mode, and to sample the data signal using the pulse signal during a second operating mode.

In one example of the apparatus, the local clock signal and the pulse signal may be based on a common clock signal. In another example, a frequency of the common clock signal in the first operating mode may be lower than the frequency of the common clock signal in the second operating mode.

An example of the apparatus may also include a mode select circuit configured to select either the first operating mode or the second operating mode based on a current performance efficiency of a processor circuit, and to disable the common clock signal during a switch between the first and second operating modes. In some examples, the operating mode signal may include a plurality of bit values. The control circuit may be further configured to select a different pulse signal based a particular combination of the bit values.

In some embodiments, the data storage circuit may include a first latch circuit and a second latch circuit. To sample the data signal during the first operating mode, the data storage circuit may be further configured to latch, in the first latch circuit, a value of the data signal in response to a rising transition of the local clock signal, and to latch, in the second latch circuit, the value of the data signal in response to a subsequent falling transition of the local clock signal.

BRIEF DESCRIPTION OF THE DRAWINGS

The following detailed description makes reference to the accompanying drawings, which are now briefly described.

Figure 1:
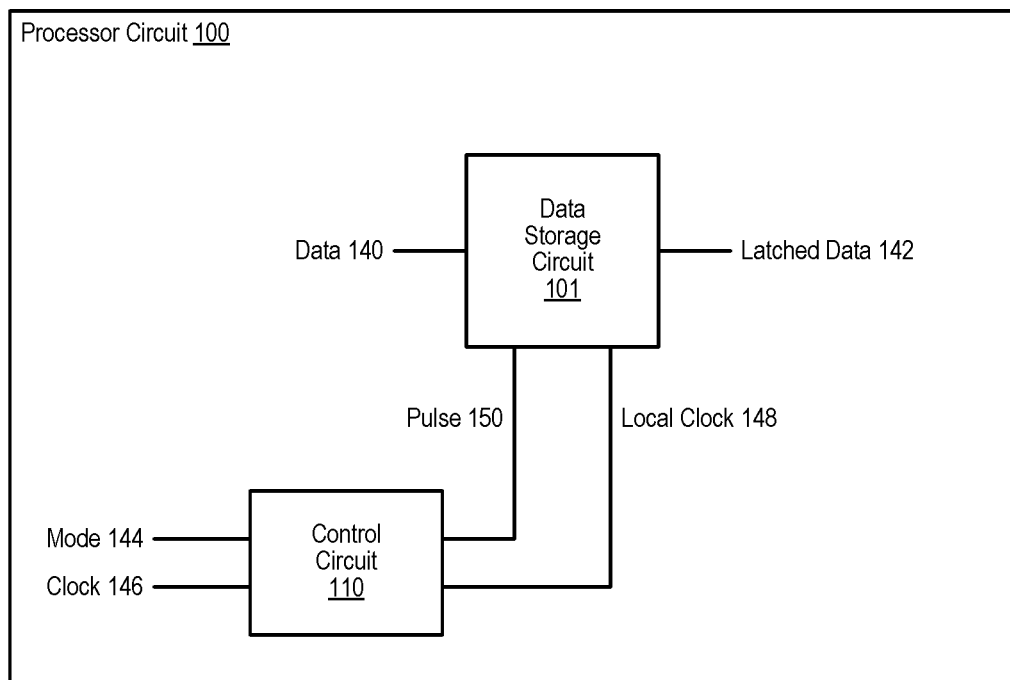
FIG. 1 illustrates a block diagram of an embodiment of a processor circuit.
Figure 1:
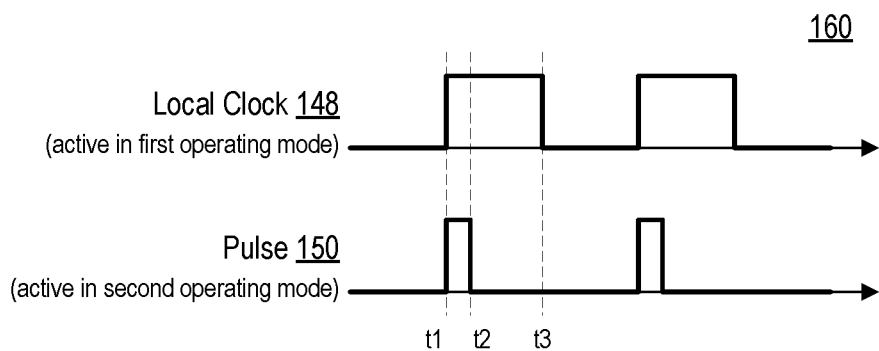

While the disclosure is susceptible to various modifications and alternative forms, specific embodiments thereof are shown by way of example in the drawings and will herein be described in detail. It should be understood, however, that the drawings and detailed description are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Many computer systems that are reliant on processors may be expected to operate efficiently over a variety of conditions. Users of portable computing devices, such as smart phones and smart watches, may expect the devices to operate for many hours or several days without recharging during normal usage. When performance is needed, however, such as playing a game with intense graphics on a smart phone, or jogging/biking with a smart watch that is providing maps and music while monitoring health data of the wearer, the user's expectation is for the device to perform smoothly, without interruptions. Such user expectations may place demands on processor circuits to be capable of running efficiently in reduced power operating modes as well as in high performance operating modes when requested. To manage power, many computer systems employ usage of multiple operating modes. An "operating mode," as used herein, refers to use a particular combination of operating parameters, such as a particular voltage level for a power signal and/or a particular frequency a clock signal. A computer system may, for example, include one operating mode for use when performance is desired, this mode including selection of voltage levels and frequencies that support an increased processing bandwidth. This computer system may include a different operating mode for use when conserving power is desired rather than high performance. This different mode may include selections of voltage levels and/or clock signal frequencies that are lower than a performance oriented operating mode.

Performance of data storage circuits in processors may impact how well the processors perform over the expected conditions. Various types of data storage circuits may be used a processor design. Some data storage circuit designs may function well at lower voltages to accurately capture data values on a signal, but they may be limited for use at higher frequencies. Other data storage circuit designs may be capable of running at higher frequencies, but may consume excess power and/or perform poorly in reduced power operating modes. Designing one data storage circuit for proper operation at high performance as well as for reduced power operating modes may require additional circuit area, for example, to include additional delay circuits and/or to increases sizes of circuit devices for improved performance across a wider operating range. Such data storage circuits designed for wide operating ranges may also consume more power due to the increased circuitry and larger devices. These drawbacks result in data storage circuits with wide operating ranges to be used sparingly in processor designs that are restricted in circuit area and/or are sensitive to increases in power consumption.

A data storage circuit that is capable of supporting multiple operating modes while reducing or eliminating the above-mentioned drawbacks is, therefore, desired for many processor designs. Embodiments of data storage circuits with multiple operating modes for reduced power operation as well as high frequency operation are presented below. For example, one disclosed embodiment is a hybrid of a pulse latch and a master-slave flip-flop. To improve efficiency and performance of processors across operating ranges, this hybrid storage circuit operates as pulse latch when high frequency operation is enabled and then switches to operate as a master-slave flip-flop when a reduced power mode is enabled. In some embodiments, a hybrid data storage circuit may also save circuit area compared to using a pulsed data latch that is modified to operate across a wider range of conditions. A modified pulse latch may require several large delay circuits in order to provide suitable timing across a variety of operating modes. The hybrid data storage circuit, in contrast, may share some circuitry between the pulse latch and the flip-flop circuits, thereby reducing an amount of additional circuitry.

A processor circuit is used herein as an exemplary embodiment. It is contemplated, however, the disclosed concepts may be applied to other types of synchronous logic circuits. For example, the disclosed data storage circuits may be implemented in control circuits for memory arrays, communication circuits, timing circuits, security modules, and the like.

A block diagram of an embodiment of processor circuit is presented in FIG. 1. As illustrated, Processor Circuit 100 includes data storage circuit 101 and control circuit 110. Control circuit 110 receives mode signal 144 and clock signal 146, and generates pulse signal 150 and local clock 148. Data storage circuit 101 generates latched data signal 142 based on received data signal 140. As described below in more detail, Processor Circuit 100 may be included in a computer system, or fabricated on a common integrated circuit substrate with other circuits to form a System-on-a-chip (SoC).

Processor circuit 100, in various embodiments, may correspond to a processing core, a state machine, or other type of sequential logic circuit. Although a single data storage circuit 101 is shown for clarity, processor circuit 100 may include additional data storage circuits. One or more logic gates or other digital circuits may be included between data storage circuit 101 and other data storage circuits. Control circuit 110 generates, based on mode signal 144, either local clock 148 or pulse signal 150. Through the selection of either local clock 148 or pulse signal 150, control circuit 110 controls an operating mode of data storage circuit 101 and may further control one or more other included data storage circuits.

As illustrated, data storage circuit 101 samples data signal 140 using local clock 148 during a first operating mode, and samples data signal 140 using pulse signal 150 during a second operating mode. The captured data sample is generated as an output signal, latched data 142. Control circuit 110 selects either the first operating mode or the second operating mode based on a current performance efficiency of processor circuit 100. The "performance efficiency," as used herein, corresponds to an amount of processing performed by a processor within a particular amount of time. For example, performance efficiency may be determined based on a number of idle cycles occurring in a processor during a particular number of total cycles, or over a particular amount of time. An increase in a number of idle cycles may correspond to a decrease in performance efficiency, and vice versa. In other words, performance efficiency may correspond to a percentage of time that a processor is idle.

Differences between the first operating mode and the second operating mode may include voltage levels of one or more power signals, including a power signal that supplies power to processor circuit 100, including data storage circuit 101. A frequency of clock signal 146 may also differ between the first and second operating modes. For example, in one embodiment, the first operating mode may correspond to a reduced power operating mode in which both a voltage level of a power supply signal and a frequency of clock signal 146 are lower than in the second operating mode. The second operating mode, in this example, corresponds to a high-performance operating mode. When the performance efficiency of processor circuit 100 is below a particular threshold level, the first operating mode is enabled to order to conserve power during times when processor bandwidth is not in demand. Conversely, when the performance efficiency is above the threshold, indicating fewer idle cycles and, therefore, a demand for more processor bandwidth, the second performance mode is enabled.

As illustrated, control circuit 110 selects either the first or second performance operating mode based on mode signal 144. To cause data storage circuit 101 to enter either the first or second operating mode, control circuit 110 generates either pulse signal 150 or local clock 148. In typical embodiments, such as shown in timing diagram 160, local clock 148 has a longer high time, from times t1 to t3, than pulse signal 150 which has a high time from times t1 to t2. In some embodiments, both local clock 148 and pulse signal 150 may be generated from a same source clock signal, such as clock signal 146. In other embodiments, local clock 148 and pulse signal 150 may be generated from different source clock signals. It is noted that, although local clock 148 and pulse signal 150 are depicted as being active at similar points in time, this overlap is for the purpose of comparing relative pulse widths of the two signals. In the illustrated embodiment, the two signals are active while their respective operating modes are active.

Although other suitable technologies may be employed, it is noted that embodiments illustrated and described herein are described as complementary metal-oxide-semiconductor (CMOS) circuits. For the sake of clarity, it is noted that "high," "high time," or "high level" refers to a voltage sufficiently large to turn on a n-channel metal-oxide semiconductor field-effect transistor (MOSFET) and turn off a p-channel MOSFET while "low," "low time," or "low level" refers to a voltage that is sufficiently small enough to do the opposite. In other embodiments, different technology may result in different voltage levels for "low" and "high."

Data signal 140, as shown, indicates a data value of "1" or "0," corresponding to a high and a low, respectively. Over time, this data value may change due to one or more other signals and, therefore, data storage circuit 101 is used to capture and store a value of data signal 140 at a particular point in time. In the first operating mode, data storage circuit 101 may capture a current value of data signal 140 based on rising and falling transitions of local clock 148. For example, data storage circuit 101 may sample or capture a value of data signal 140 in response to a rising transition of local clock 148 and then store the sampled value in response to a subsequent falling transition of local clock 148.

To accurately capture a correct value, the value of data signal 140 must not change near a rising transition of local clock 148. Setup and hold times may be used to determine how near to a transition of local clock 148 that data signal 140 can safely change value. In some embodiments, setup and hold times may be referenced to the rising transition of local clock 148, and vice versa in other embodiments. As used herein, a "setup time" specifies an amount of time prior to a clock transition during which the data signal must remain constant. A "hold time" specifies an amount of time after the same transition that the data signal must continue to remain consistent.

As illustrated, data storage circuit 101 captures a value of data signal 140 at a rising transition of local clock 148, and therefore, setup and hold times may be referenced to the rising transitions. As a frequency of local clock 148 is increased, circuits generating data signal 140 may not be capable of holding data signal 140 to a constant value between the setup and hold times to accurately capture and store a current value of data signal 140. In addition, data storage circuit 101 may require a minimum amount of time between falling and rising transitions of local clock signal 148. At increased frequencies of local clock 148, therefore, errors may start to occur while operating in the first operating mode, resulting in incorrect values of data signal 140 to be captured.

In the second operating mode, data storage circuit 101 may capture a current value of data signal 140 starting from the rising transition (time t1) thru any time t0 the falling transition (time t2) of pulse signal 150. Data storage circuit 101, therefore, may not be as sensitive to a high frequency on pulse signal 150 in the second operating mode as it is to a same high frequency on local clock 148 while in the first operating mode. Since data storage circuit 101 can capture the value of data signal 140 any time between the rising and falling clock transitions of pulse signal 150, a minimum amount of time between falling and rising transitions of pulse signal 150 may be less than when operating in the first operating mode. In various embodiments, setup and hold times in the second operating mode may be the same or less than in the first operating mode.

Use of the second operating mode may, therefore, allow for data storage circuit 101 to function at increased operating frequencies. If, however, data storage circuit 101 is optimized for high frequency operating in the second operating mode, then data storage circuit 101 may not operate well at lower voltage levels of the power supply. Using the first operating mode when the power supply voltage level is reduced, therefore, may compensate for limitations in the second operating mode.

Utilizing data storage circuit 101 with the two operating modes may, accordingly, allow processor circuit 100 to operate over a wide range of voltage and frequency conditions. As disclosed above, data storage circuit 101 may also use less circuit area than some other storage circuits designed to operate across a wide range of operating conditions.

It is noted that the block diagram of Processor Circuit 100 has been simplified in order to more easily explain the disclosed concepts. In other embodiments, different and/or additional circuit blocks, and different configurations of the circuit blocks are possible and contemplated.

Figure 2:
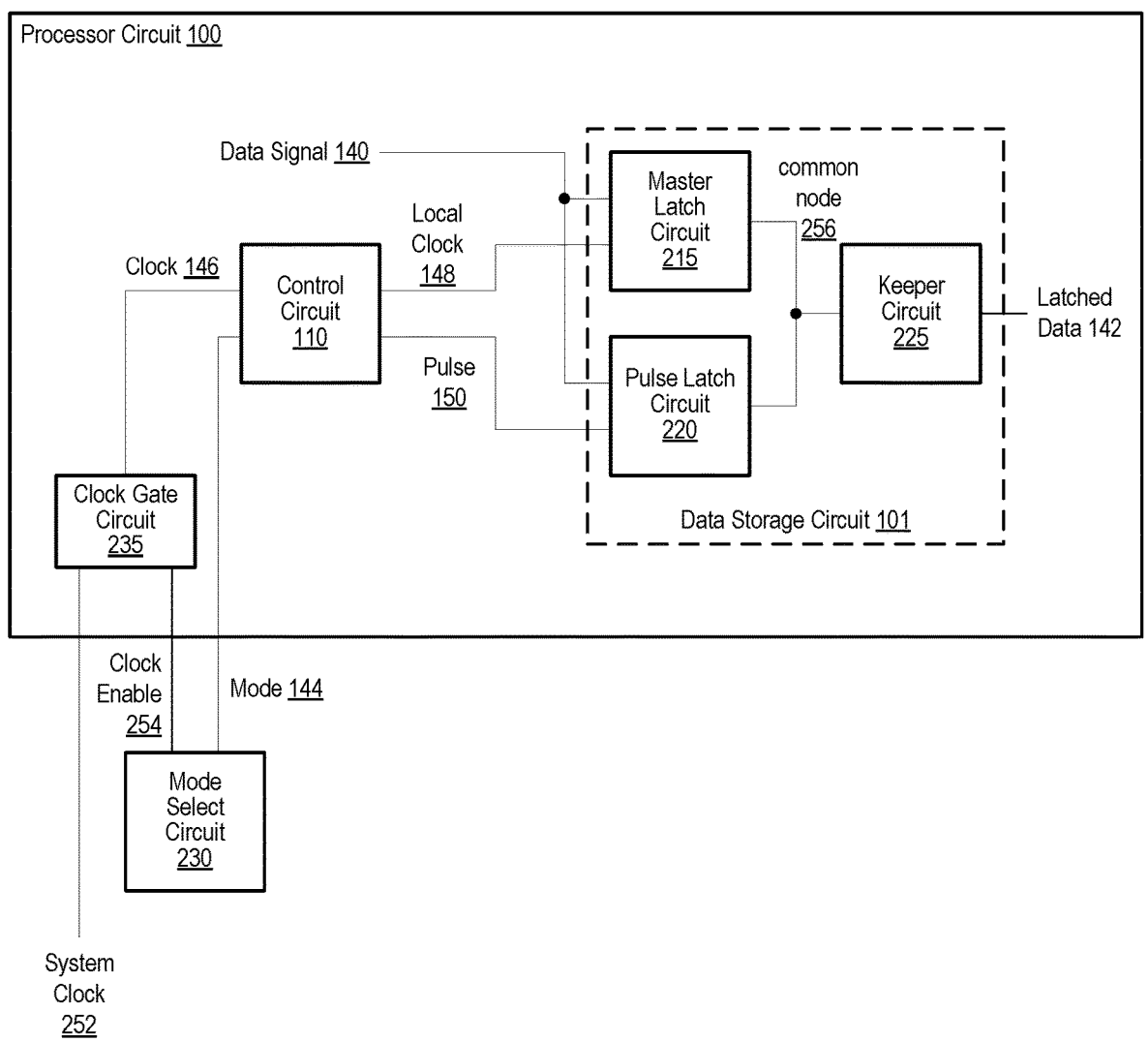
FIG. 2 shows a block diagram of an embodiment of a system that includes a processor circuit and a mode select circuit.

Turning to FIG. 2, a system including processor circuit 100 is shown. System 200 includes processor 100 as well as mode select circuit 230. Processor circuit 100 includes control circuit 110 and clock gate circuit 235. Processor circuit 100 also includes data storage circuit 101 which, in turn, includes master latch circuit 215, pulse latch circuit 220, and keeper circuit 225. In various embodiments, the circuits of system 200 may be included on a signal integrated circuit (IC) or may be included on two or more ICs coupled together via one or more circuit boards. In various embodiments, mode select circuit 230 may be included as part of a power management circuit, or part of a system configuration circuit. Although shown as separate, in some embodiments, mode select circuit 230 may be included as a part of processor circuit 100.

Mode select circuit 230, as illustrated, generates two control signals: mode signal 144 and clock enable signal 254. As described above, mode signal 144 provides an indication of a current operating mode to control circuit 110, such as indicating either the first or second operating modes. Mode select circuit 230 may indicate the first operating mode when the performance efficiency of processor circuit 100 is below a particular threshold level, and may indicate the second operating mode when the performance efficiency is above the threshold level. In some embodiments, mode select circuit 230 may determine a current performance efficiency, while in other embodiments, mode select circuit 230 receives an indication of the current performance efficiency of processor circuit 100. In response to determining that the current performance efficiency has crossed the threshold level, either rising above the threshold or falling below it, mode select circuit 230 de-asserts clock enable signal 254.

Clock enable signal 254 is received by clock gate circuit 235. When asserted, clock enable signal 254 causes clock gate circuit 235 to generate clock signal 146 based on system clock 252. In some embodiments, clock gate circuit 235 may correspond to a transmission gate that, when enabled, allows system clock 252 to pass through as clock signal 146. In other embodiments, additional circuits, such as frequency dividers, delay circuits, level shifters, and the like, may be included and may modify one or more characteristics of clock signal 146 from system clock 252. When clock enable signal 254 is de-asserted, clock gate circuit 235 blocks propagation of system clock 252, thereby disabling clock signal 146. While clock signal 146 is disabled, mode signal 144 is switched, for example, from a value indicating the first operating mode to a value indicating the second operating mode, or vice versa. In the illustrated embodiment, mode signal 144 corresponds to a single bit of data, with, for example, a high logic value corresponding to the first operating mode and a low logic value corresponding to the second operating mode. Other embodiments, however, are contemplated in which mode signal 144 corresponds to a multi-bit data value to indicate more than two operating modes.

As shown, control circuit 110 receives mode signal 144 and may switch operating modes of data storage circuit 101 in response to a change in the value of mode signal 144. For example, mode signal 144 may currently indicate the first operating mode. In some embodiments, the first operating mode is a reduced power mode in which a power supply voltage level is lower than that of the second operating mode. In the first operating mode, control circuit 110 generates local clock 148, based on clock signal 146, while pulse signal 150 is disabled. As used herein, a "disabled" signal refers to a signal that does not transition, instead remaining at a steady logic high or logic low level until enabled. In response to particular transitions on local clock 148 (e.g., rising transitions), master latch circuit 215 latches a value of data signal 140 and drives common node 256 with the latched value. After master latch circuit 215 latches the value, keeper circuit 225 transitions a value on latched data signal 142 based on the latched value on common node 256.

While pulse signal 150 is disabled, pulse latch circuit 220 is inactive. While inactive, an output of pulse latch circuit 220 is in an impedance state that is sufficiently large as to prevent loading other circuits (e.g., high impedance or "tristate"). Pulse latch circuit 220, therefore, does not drive common node 256 to either a high or a low logic level, allowing instead, master latch circuit 215 to drive the logic level on common node 256. With pulse latch circuit 220 in a disabled state, master latch circuit 215 and keeper circuit 225 may operate together as a master-slave flip-flop circuit. A master-slave flip-flop captures a value of a data signal in a master latch portion of the flip-flop during one portion of a clock cycle and then transfers the captured data value into a slave latch during a subsequent portion of the clock cycle. A typical master-slave flip-flop design may function well at lower voltages to accurately capture data values on a signal, but due to the two-step process for storing captured data, they may be limited from use at the higher frequencies of some circuit technologies.

When mode select circuit 230 determines that a switch to the second operating mode is going to be made, clock enable signal 254 is de-asserted, causing clock signal 146 to be disabled. Control circuit 110 does not generate transitions or either local clock 148 or pulse signal 150, and data storage circuit 101, specifically keeper circuit 225, drives latched data 142 with a last latched data value on common node 256. Mode select circuit 230 changes mode signal 144 to the value representing the second operating mode. Mode select circuit 230 may wait for a suitable number of cycles of system clock 252 before and/or after switching the value of mode signal 144. These cycles of system clock 252 may allow for processor circuit 100 to reach a stable state, e.g., transitioning signals internal to processor circuit 100 are allotted time t0 complete their respective transitions.

Once the transition to the second operating mode is complete, mode select circuit 230 asserts clock enable signal 254 and clock gate circuit 235 generates clock signal 146 again. Control circuit 110, in response to the change in the value of mode signal 144, disables local clock 148 and instead generates transitions on pulse signal 150 based on clock signal 146. As shown in FIG. 1, control circuit 110 may generate a pulse on pulse signal 150 for each rising transition of clock signal 146 or may, in other embodiments, may generate a pulse on each falling transition of clock signal 146. Disabling local clock 148 causes master latch circuit 215 to be disabled, thereby tristating its output to common node 256. When pulse signal 150 is asserted to a high logic level, pulse latch circuit 220 generates a value based on data signal 140 on common node 256. Keeper circuit 225 generates a value on latched data 142 based on the value of common node 256 and retains this value when pulse signal 150 returns to a low logic level.

In the second operating mode, with master latch circuit 215 disabled, pulse latch circuit 220 and keeper circuit 225 work together as a pulse latch to capture values of data signal 140. A pulse latch includes a pass gate (e.g., pulse latch circuit 220) and a keeper latch (e.g., keeper circuit 225). A control signal pulse opens the pass gate while the pulse is asserted and the keeper latch stores the value that is passed through the gate. A pulse latch may therefore, be capable of running at higher frequencies since a two-step process is not used as is with the master-slave flip-flop circuit. A path, however, is opened from the data signal to the keeper latch that may require a longer hold time on the data signal than is required with the master-slave flip-flop. In this pulse latch configuration, data storage circuit 101 may be capable of operating at higher frequencies of clock signal 146 than in the flip-flop configuration of the first operating mode. Data storage circuit 101, however, may use the flip-flop configuration of the first operating mode to avoid the open path from data signal 140 to keeper circuit 225, when not running at higher frequencies. It is noted that keeper circuit 225 is utilized in both the flip-flop and pulse latch configurations.

It is also noted that system 200 of FIG. 2 is one example for demonstrating the disclosed concepts. In other embodiments, additional circuit blocks may be included. For example, the control circuit may be coupled to a plurality of data storage circuits, capturing values for various data signals.

Figure 3A:
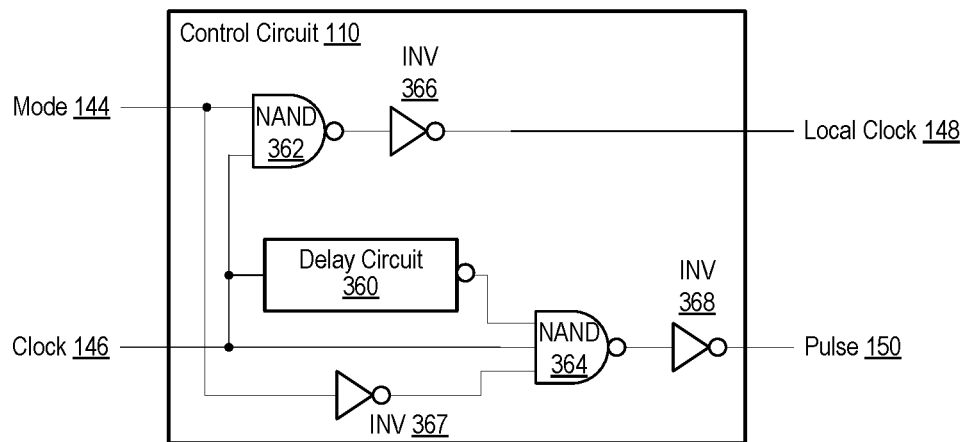
FIG. 3A depicts a block diagram of an embodiment of a control circuit that supports two operating modes.
Figure 3B:
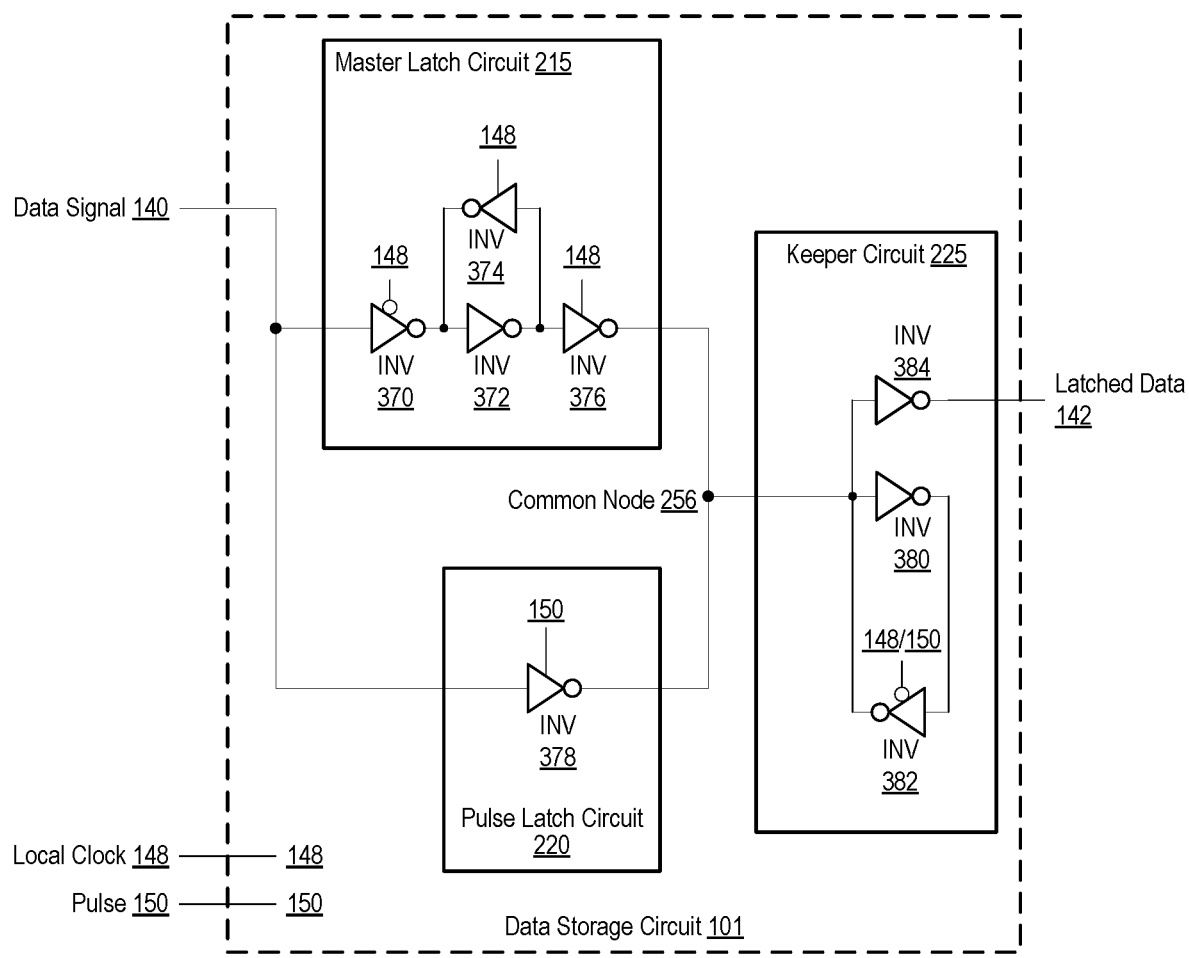
FIG. 3B illustrates a block diagram of an embodiment of a data storage circuit.

Components of a data storage circuit are described in FIG. 2. Moving to FIG. 3A, details of a control circuit are illustrated. In addition, further details of the components of a data storage circuit are shown in FIG. 3B. Control circuit 110 in FIG. 3A includes several logic gates, including NAND gates 362 and 364, and inverter circuits (INV) 366, 367, and 368. In addition, control circuit 110 includes delay circuit 360. As previously shown in FIGS. 1 and 2, control circuit 110 receives mode signal 144 and clock signal 146, and generates either local clock 148 or pulse signal 150 based on the received signals.

As illustrated, when mode signal 144 is asserted high (indicating the first operating mode), the output of INV 367 is low and the output of NAND gate 364 will remain at a high logic level regardless of the values of clock signal 146 or the output of delay circuit 360. Accordingly, the output of INV 368, i.e., pulse signal 150, remains low. The output of NAND gate 362, however, is determined by the value of clock signal 146. When the value of clock signal 146 is high, both inputs to NAND gate 362 are high, and the output goes low, thereby causing the output of INV 366 (i.e., local clock 148) to go high. When clock signal 146 goes low, the opposite occurs. The output of NAND gate 362 goes high, causing local clock 148 to go low. Local clock 148, in the illustrated embodiment, is therefore the same as clock signal 146, except for any delays through NAND gate 362 and INV 366. As disclosed above, in other embodiments, additional circuit elements may be included that differentiate local clock 148 from clock signal 146, such as level shifters or clock dividers.

When mode signal 144 is de-asserted to a low value (indicating the second operating mode), the output of NAND gate 362 goes high, regardless of the value of clock signal 146. Local clock 148, accordingly, goes and remains low. The low value of mode signal 144 causes the output of INV 367 to go high. The output of NAND gate 364 is, therefore, determined by the values of clock signal 146 and the output of delay circuit 360. In the illustrated embodiment, delay circuit 360 receives clock signal 146 and generates a complementary output value after a particular amount of time, e.g., a delay time. In other embodiments, the output value may not be a complement of the input. The delay time may be fixed by a design of delay circuit 360 or, in other embodiments, may adjustable by using, for example, bias transistors in a chain of inverter circuits. The delay time will, typically, be shorter than one half of a period of clock signal 146, although, at high frequencies of clock signal 146, for example, the opposite may be true.

When clock signal 146 transitions from a low to a high value, the output of delay circuit 360 will remain at a high value (complement of the initial low value of clock signal 146) until the delay time elapses. All three inputs to NAND gate 364, therefore, are high from the point at which clock signal 146 transitions high to the point when the output of delay circuit 360 transitions low. In other words, the three inputs are high for an amount of time equal to the delay time of delay circuit 360. While the three inputs are high, the output of NAND gate 364 is low, causing the output of INV 368 (i.e., pulse signal 150) to be high. Once the output of delay circuit 360 goes low at the end of the delay time, the output of NAND gate 364 goes high and pulse signal 150 goes low. When clock signal 146 transitions low, the output of NAND gate 364 remains low, while the output of delay circuit 360 transitions high after the delay time. The output of NAND gate 364 remains low until the next time clock signal 146 transitions high.

The output signals of control circuit 110, local clock 148 and pulse signal 150, are received by data storage circuit 101. One embodiment of data storage circuit 101 is shown in FIG. 3B in more detail than in FIGS. 1 and 2. As in FIG. 2, data storage circuit 101 is illustrated in FIG. 3B as including master latch circuit 215, pulse latch circuit 220, and keeper circuit 225. Master latch circuit 215 includes four inverter circuits (INV) 370, 372, 374, and 376. Pulse latch circuit 220 includes inverter circuit (INV) 378. Keeper circuit 225 includes three inverter circuits (INV) 380, 382, and 384. Data storage circuit 101 captures a value of data signal 140 based on the received signals local clock 148 and pulse signal 150. The captured value is stored and generated as output signal, latched data 142.

As illustrated, in the first operating mode, when local clock 148 is active and pulse signal 150 remains low (e.g., is disabled), pulse latch circuit 220 is disabled. INV 378 in pulse latch circuit 220 is enabled by a high level on pulse signal 150, and therefore, when pulse signal 150 is low, INV 378 is disabled. Master latch circuit 215 is enabled when local clock 148 is enabled. When local clock 148 is low, INV 370 is enabled and generates an output with a value complementary to the value of data signal 140. INV 372 remains enabled regardless of the value of local clock 148 and, therefore, generates an output value complementary to the output of INV 370, or, in other words, generates an output value equal to the value data signal 140. When local clock 148 transitions to a high value, INV 370 is disabled while INVS 374 and 376 are enabled. INV 372 continues to generate an output equal to the value of data signal 140 at the time that local clock 148 transitioned high. INV 374 generates an output that is complementary to the output of INV 372, thereby storing (also referred to as latching or sampling) this value of data signal 140. INV 376 generates a complementary value as an output on common node 256. The sampled value stored on common node 256 is, therefore, the complement of the value of data signal 140. INVS 380 and 384, in keeper circuit 225, remain enabled regardless of the value of local clock 148, and both generate outputs with values complementary to the value of common node 256, which is, accordingly, the stored value of data signal 140. When local clock 148 transitions back to a low value, INV 382 is enabled and generates an output value complementary to the output of INV 380, thereby latching the value on common node 256 as INV 376 is disabled by the low transition of local clock 148.

In the second operating mode, when pulse signal 150 is enabled and local clock 148 remains low (e.g., is disabled), master latch circuit 215 is disabled. INV 370 in master latch circuit 215 is enabled, but INVs 374 and 376 remain disabled while local clock 148 remains low, preventing any values of data signal 140 from being stored. INV 378 of pulse latch circuit 220, is enabled when pulse signal 150 is high, causing INV 378 to generate the complementary value of data signal 140 on common node 256. INVS 380 and 384 receive the value on common node 256 and generate respective outputs with a value complementary to the value on common node 256, which corresponds, accordingly, to the value of data signal 140. Latched data 142, therefore, is driven to a same value as data signal 140. When pulse signal 150 transitions low, INV 378 is disabled. The value of data signal 140 at the time INV 378 is disable corresponds to a sampled value of data signal 140 as this value may not change until pulse signal 150 transitions high again. INV 380 continues to generate an output corresponding to the sampled value of data signal 140. INV 382 is disabled when either pulse signal 150 or local clock 148 is high. When pulse signal 150 transitions low, therefore, INV 382 is enabled and generates an output with a value complementary to the output of INV 380, thereby storing the latched value of data signal 140. This storing of the latched value of data signal 140 holds the stored value on latched data 142, which may then be utilized by other subsequent circuits.

It is noted that when pulse signal 150 is high, changes of the value of data signal 140 may be propagated through INV 378 to INV 384. This transparency of data storage circuit 101 in the second operating mode can, under certain conditions, allow for glitches on data signal 140 to propagate through to latched data 142. To prevent this undesired effect, the delay time of delay circuit 360 may be selected to generate a high pulse on pulse signal 150 that meets a minimum duration for keeper circuit 225 to accurately capture a value on common node 256. This minimum pulse width may correspond to a smallest pulse width that allows data storage circuit 101 to function correctly in the second operating mode.

This smallest pulse width may also allow data storage circuit 101 to function at high frequencies of clock signal 146. A frequency of clock signal 146 may, therefore be higher during the second operating mode than during the first operating mode. Accordingly, frequencies of pulse signal 150, when enabled, may typically be higher than frequencies of local clock 148 when enabled.

It is further noted that the circuits shown in FIG. 3 are one embodiment. In other embodiments, different types of circuits may be utilized. For example, NAND gates may be replaced by NOR gates and include additional logic circuits to achieve a similar functionality.

In the previous examples, two operating modes have been illustrated. Proceeding to FIG. 4, an embodiment of a control circuit for a data storage circuit that supports four operating modes is illustrated. In some embodiments, control circuit 410 may correspond to control circuit 110 in FIG. 1. Control circuit 410 includes NAND gates 462 and 464a-464c, as well as inverter circuits (INV) 466 and 468a-468c, and multiplexing circuit (MUX) 470. Control circuit 410 receives clock signal 146 and mode signals 444a-444d (collectively referred to as mode signals 444). Local clock 148 and pulse signal 150 are generated as outputs of control circuit 410.

As shown, control circuit 410 supports four operating modes as compared to the two operating modes disclosed above. The four modes are selected based on mode signals 444a-444d as shown in table 480. A value of "1" indicates the selected mode. The four mode signals 444 may be generated using a suitable logic circuit which receives, for example, two mode select inputs. Each of the four operating modes may have a different power signal voltage level and/or frequency of clock signal 146. The power signal may be used as a power supply signal for control circuit 410 in some embodiments.

A first operating mode is selected when mode signal 444a is asserted. This first operating mode corresponds to the first operating mode as discussed above. NAND gate 462 and INV 466 function as described for NAND gate 362 and INV 366 in regards to FIG. 3A. Local clock 148 is generated in the same fashion as previously discussed. NAND gate 462 generates an output that is complementary to clock signal 146 and INV 466 generates a signal that is complementary to the output of NAND gate 462, such that local clock 148 may be substantially the same as clock signal 146.

As illustrated, operating modes selected when one of mode signals 444b-444d is asserted each behave similarly to the second operating mode discussed above. The additional operating modes, however, provide an option for various delay times. Three combinations of a delay circuit, a NAND gate and an inverter circuit are illustrated, leading to common multiplexing circuit, MUX 470. Each combination includes one of delay circuits 460a-460c, NAND gates 464a-464c, and INV 468a-468c. The three combinations, individually, perform as described above for the similarly named and numbered elements (delay circuit 360, NAND gate 364, and INV 368) as disclosed in regards to FIG. 3A. When a particular combination is enabled by an assertion of a respective mode signal 444b-444d, then a rising transition on clock signal 146 results in a high level pulse being generated on pulse signal 150, in which the width of the pulse is determined by a delay time of the corresponding delay circuit 460a-460c.

The delay time for each of the delay circuits 460a-460c may be set for a particular set of operating conditions that correspond to each operating mode selected by a corresponding one of mode signals 444b-444d. For example, each delay time may correspond to a different voltage level for the power signal. A voltage level that is lower than the other operating voltage levels may utilize a longer delay time t0 compensate for a data storage circuit that needs more time t0 latch a value of a data signal at lower operating voltages. In contrast, a delay time corresponding to a high operating voltage level may be shorter, since the same data storage circuit may latch values of the data signal in less time at the higher operating voltage.

Figure 4:
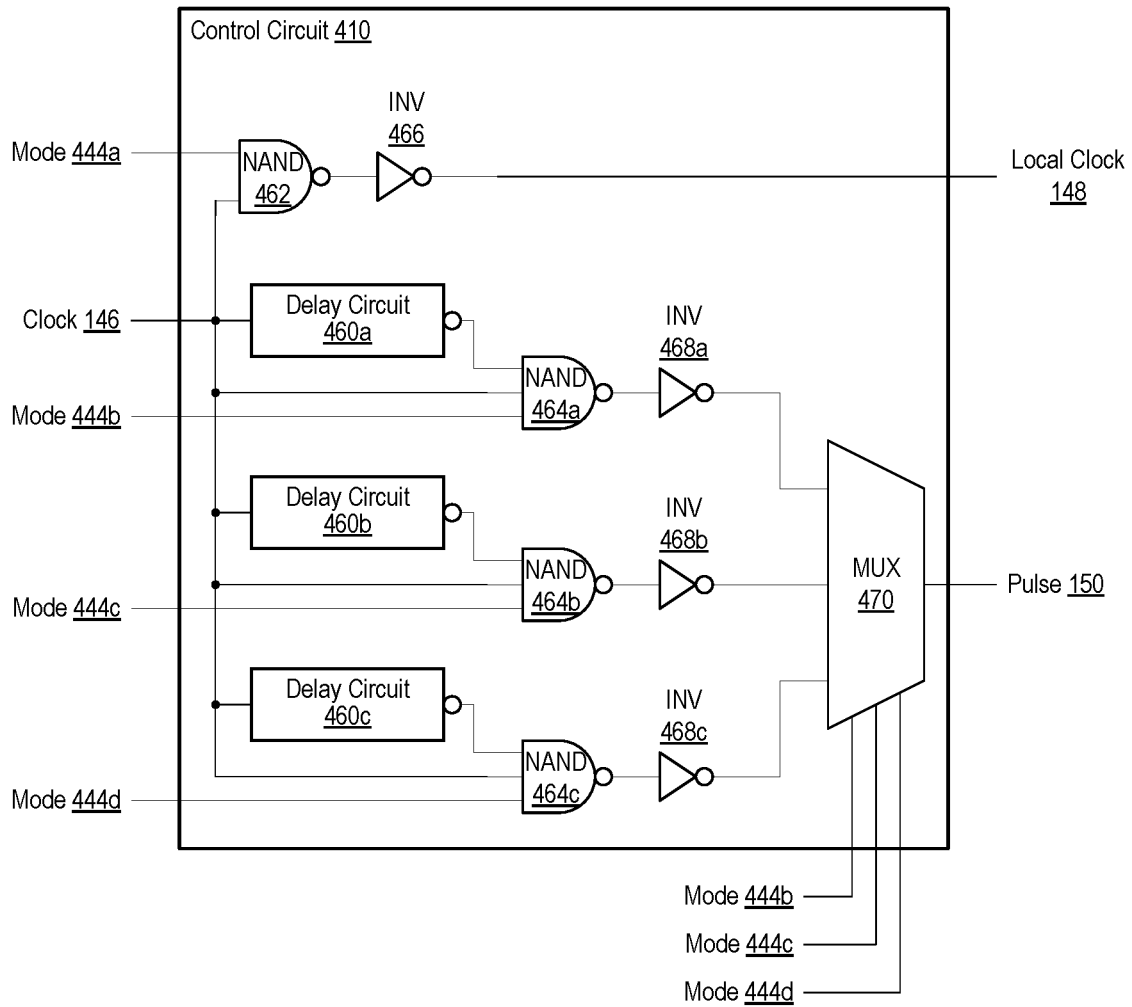
FIG. 4 shows a block diagram of an embodiment of a control circuit that supports four operating modes.

It is noted that FIG. 4 illustrates one example of a control circuit that supports more than two operating modes. Although the illustrated embodiment includes support for four operating modes, additional circuit blocks may be included to support a greater number of operating modes.

Figure 5:
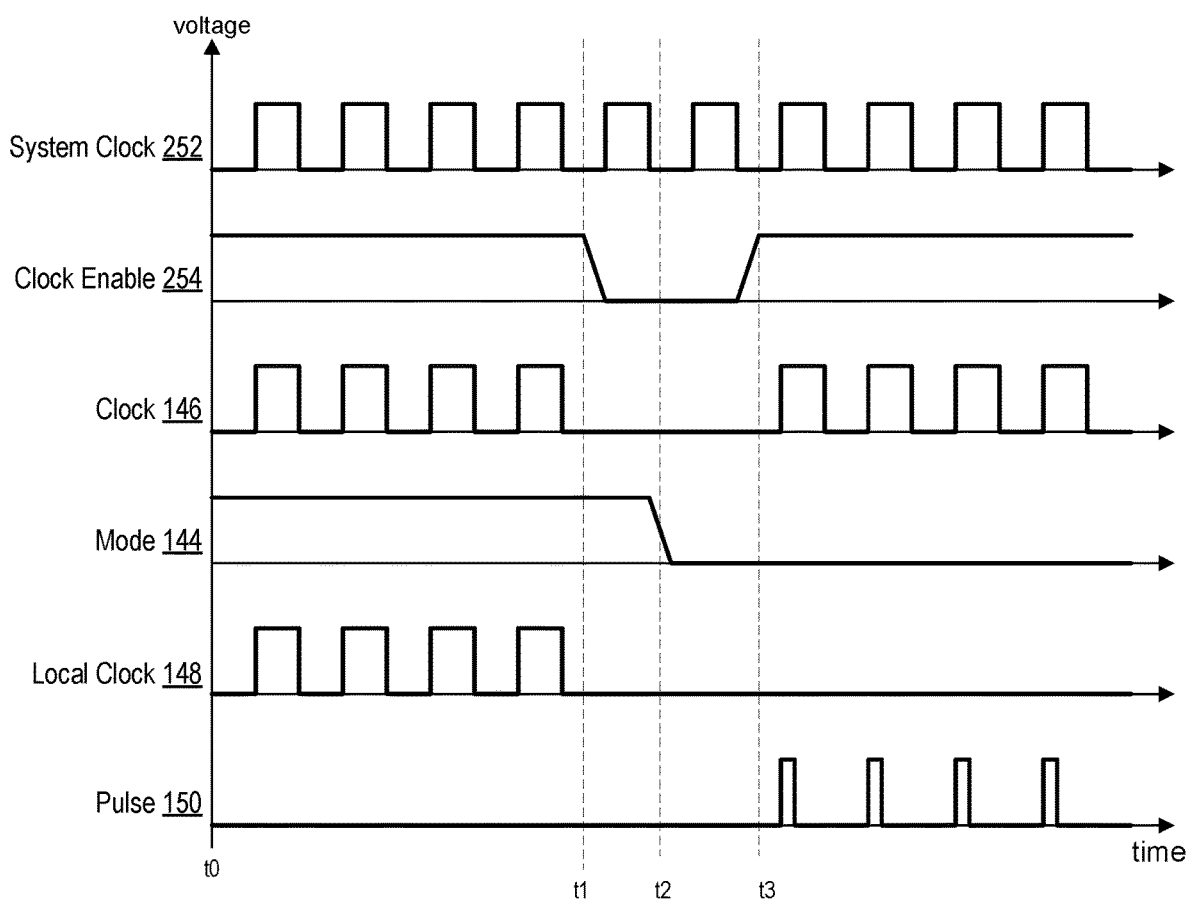
FIG. 5 depicts a timing diagram representing waveforms for an embodiment of a processor circuit.

As described above, clock signals may be disabled during a change in the value of the mode signal. Turning now to FIG. 5, a chart is illustrated that depicts waveforms associated with an embodiment of a processor circuit. Chart 500 includes six waveforms, depicting six signals that are shown in FIG. 2: system clock 252, clock enable signal 254, clock signal 146, mode signal 144, local clock 148, and pulse signal 150. The six waveforms depict voltage versus time. Referring collectively to chart 500 and FIG. 2, the waveforms begin at time t0.

At time t0, mode signal 144 is at a high level, thereby selecting the first operating mode as described above in regards to FIG. 2. As illustrated, clock enable signal 254 is high, enabling clock gate circuit 235 to generate clock signal 146 based on system clock 252. Local clock 148 is generated, by control circuit 110, based on the received clock signal 146. Since the first operating mode is selected, pulse signal 150 is disabled, e.g., held at a low level as shown. In other embodiments, pulse signal 150 may be held at a high level or may be held in a floating state when disabled.

At time t1, a decision is made to switch from the first operating mode to the second operating mode. Mode select circuit 230, for example, may determine that a performance efficiency of processor circuit 100 has reached a particular threshold and should be switched to the second operating mode to increase a performance bandwidth. As shown, mode select circuit 230 de-asserts clock enable signal 254, causing clock gate circuit 235 to hold clock signal 146 at a low level, while system clock 252 remains active. At time t2, after clock signal 146 has stopped, mode select circuit 230 changes the value of mode signal 144, in this example, from a high level to a low level.

After mode signal 144 has been changed to the new value, mode select circuit 230 asserts clock enable signal 254 at time t3, allowing clock gate circuit 235 to generate clock signal 146. Control circuit 110, now set for the second operating mode, generates pulse signal 150, using methods described above. Control circuit 110 disables local clock 148 by holding local clock 148 at a low level. In other embodiments, local clock 148 may be held at a high level or may be held in a floating state when disabled.

It is noted that chart 500 is merely an example of how signals in an embodiment of a processing core may behave. The waveforms have been simplified for clarity. For example, in other embodiments, irregularities may appear in the waveforms, such as noise coupled from other signals and nonlinear rising and falling transitions due to resistance and capacitance in the circuits. Although clock signal 146 is shown as being stopped for two clock periods, in other embodiments, clock signal 146 may be stopped for any suitable number of clock periods to allow a safe transition between the operating modes. It is contemplated that in some embodiments, clock signal 146 may be stopped for a different number of clock periods when transitioning to the first operating mode than when transitioning to the second operating mode.

Figure 6:
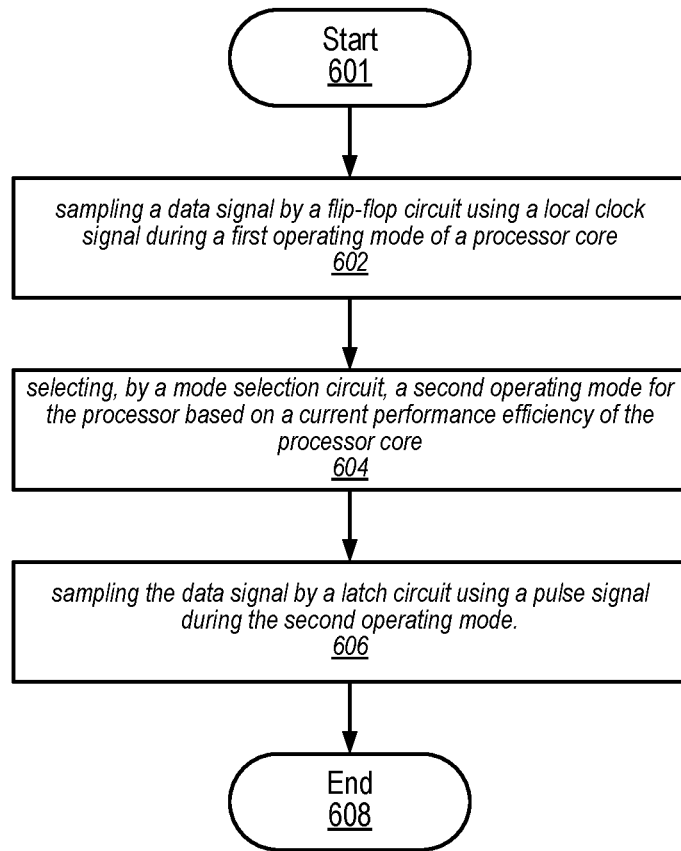
FIG. 6 illustrates a flow diagram of an embodiment of a method for selecting an operating mode.

Moving now to FIG. 6, a flow diagram for a method operating a hybrid data storage circuit in a processor circuit is illustrated. Method 600 may be applied to any of the previously disclosed embodiments, including, for example, processor circuit 100 in FIGS. 1 and 2. Referring collectively to FIG. 2 and the flow diagram of FIG. 6, method 600 begins in block 601.

A flip-flop circuit samples a data signal using a local clock signal during a first operating mode of a processor core (block 602). As shown, a flip-flop circuit including master latch circuit 215 and keeper circuit 225 is active when mode signal 144 is at a first value, such as when asserted high, thereby selecting the first operating mode. In this first operating mode, control circuit 110 generates local clock 148 based on clock signal 146, and disables pulse signal 150 by holding it low. As described above, master latch circuit 215 samples data signal 140 in response to a particular transition of local clock 148, for example, a falling transition. In response to a subsequent rising transition of local clock 148, keeper circuit 225 stores the value sampled by master latch circuit 215.

A mode selection circuit selects a second operating mode for the processor based on a current performance efficiency of the processor core (block 604). Mode select circuit 230, in the illustrated embodiment, selects a value of mode signal 144 which in turn sets an operating mode for processor circuit 100. In some embodiments, mode select circuit 230 selects a particular operating mode in response to an indication of the current performance efficiency of processor circuit 100. In some embodiments, the performance efficiency may be based on a number of instructions performed by processor circuit 100 over a particular number of cycles of system clock 252. A high number of instructions executed in a given time frame (e.g., a few idle cycles) may indicate that processor circuit 100 is operating at a high efficiency. When processor circuit 100 is operating at a high efficiency, increasing a frequency of system clock 252 allows an increase in the number of instructions that may be executed within a similar time frame. To support the increased frequency of system clock 252, mode select circuit 230 switches to the second operating mode by changing the value of mode signal 144 from high to low. A frequency of clock signal 146, therefore, may be higher during the second operating mode than during the first operating mode.

A latch circuit samples the data signal using a pulse signal during the second operating mode (block 606). As illustrated, a latch circuit that includes pulse latch circuit 220 and keeper circuit 225 is active when mode signal 144 is at a second (e.g., low) value, thereby selecting the second operating mode. In this second operating mode, control circuit 110 generates pulse signal 150 based on clock signal 146, and disables local clock 148 by holding it low. As previously described, pulse latch circuit 220 generates an output signal on common node 256 based on data signal 140 while pulse signal 150 is asserted high. In response to pulse signal 150 transitioning low, keeper circuit 225 stores the value generated on common node 256 by pulse latch circuit 220. The method ends in block 608.

It is noted that method 600 is one example of a method for selecting an operating mode of a processor circuit. In other embodiments, additional operations may be included. For example, method 700, illustrated in FIG. 7, depicts additional operations that may be implemented as a part of block 604.

Figure 7:
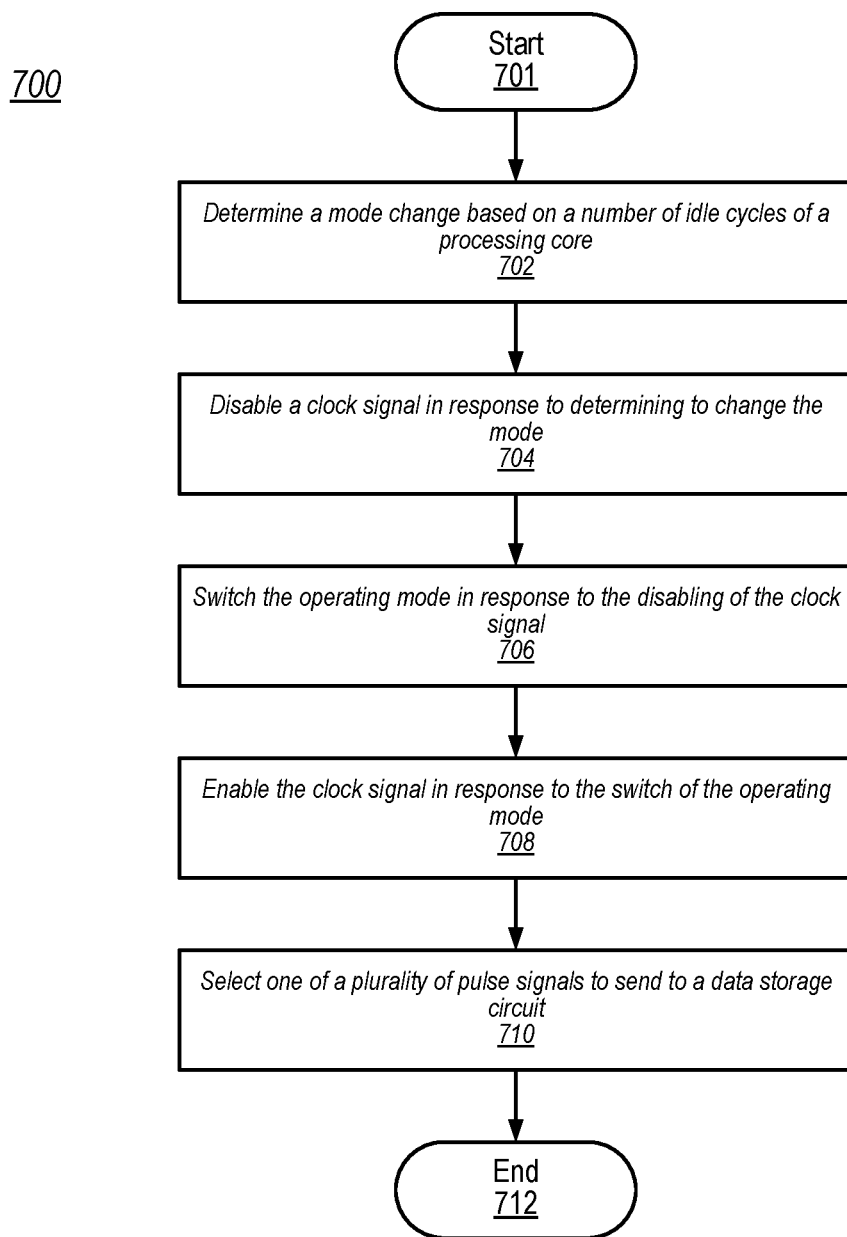
FIG. 7 depicts a flow diagram of an embodiment of a method for changing a value of a mode signal.

Proceeding now to FIG. 7, a flow diagram depicting a method for changing operating modes in a processor circuit is illustrated. Method 700, in some embodiments, may be implemented, in whole or in part, with method 600 of FIG. 6. Operations of method 700 may be performed, for example, by system 200 in FIG. 2. Referring collectively to FIG. 2 and the flow diagram of FIG. 7, the method begins in block 701.

A mode selection circuit determines a mode change based on a number of idle cycles of a processing core (block 702). As illustrated, mode select circuit 230 determines that a mode change is to be made based on an indication of a performance efficiency. For example, a current mode may correspond to a first operating mode, such as a reduced power mode which was entered after determining that a number of idle cycles of processor circuit 100 during a particular period of time was above a threshold value. In the first operating mode, control circuit 110 generates local clock 148 based on clock signal 146, while pulse signal 150 is disabled. Mode select circuit 230 detects a more recent number of idle cycles has reached or fallen below the threshold value, indicating that processor circuit 100 is more active and may require an increase in performance bandwidth. Mode select circuit 230 decides to select a different, higher performance operating mode for processor circuit 100.

The mode selection circuit disables a clock signal in response to determining to change the mode (block 704). After determining that a mode change will be made, mode select circuit 230 de-asserts clock enable signal 254, causing clock gate circuit to disable clock signal 146. With clock signal 146 disabled (e.g., held at a high or low level, or in a floating state) control circuit 110 disables local clock 148 and data storage circuit 101 ceases to store new values of data signal 140, instead, maintaining the last stored value before clock signal 146 was disabled.

The mode selection circuit switches the operating mode in response to the disabling of the clock signal (block 706). As shown, mode select circuit 230 changes the value of mode signal 144 from the value indicating the first operating mode to a new value indicating the newly selected mode. Mode select circuit 230 may delay the change in value of mode signal 144 for one or more cycles of system clock 252 in order to allow time for signals propagating through circuits in processor circuit 100 to reach a static state. Once circuits have had time t0 stabilize, mode select circuit 230 changes mode signal 144 to the new value.

The mode selection circuit enables the clock signal in response to the switch of the operating mode (block 708). After mode signal 144 has been set to the new value, mode select circuit 230 asserts clock enable signal 254 to re-enable clock signal 146. Mode select circuit 230 may delay the assertion of clock enable signal 254 to allow time for control circuit 110 and other similar control circuits in processor circuit 100 to respond to the change in the value of mode signal 144.

A control circuit selects one of a plurality of pulse signals to send to a data storage circuit (710). In some embodiments, the control circuit may correspond to control circuit 110 shown in FIG. 3A which is capable of operating in one of two modes: generating local clock 148 or pulse signal 150. In other embodiments, the control circuit may correspond to control circuit 410 depicted in FIG. 4. Control circuit 410 supports four operating modes: a first operating mode in which local clock 148 is generated and three additional operating modes in which pulse signal 150 is generated with one of three different pulse widths. When the control circuit corresponds to control circuit 410 or another control circuit with multiple pulse signals, the value indicated by mode signal 144 includes two or more bits of information. With these two or more bits of information, one of mode signals 444b-444d is asserted based on the new value. In response to the asserted one of mode signals 444b-444d, MUX 470 selects the one output from the outputs of INV 468a-468c, each of which generates a respective pulse signal with a respective pulse width. The selected output signal is used as pulse signal 150. The method ends in block 712.

It is noted that the method of FIG. 7 is merely an example. In other embodiments, additional operations may be included. For example, in some embodiments, an acknowledge signal may be received by the mode select circuit to indicate that it is safe to switch the value of the mode signal.

Figure 8:
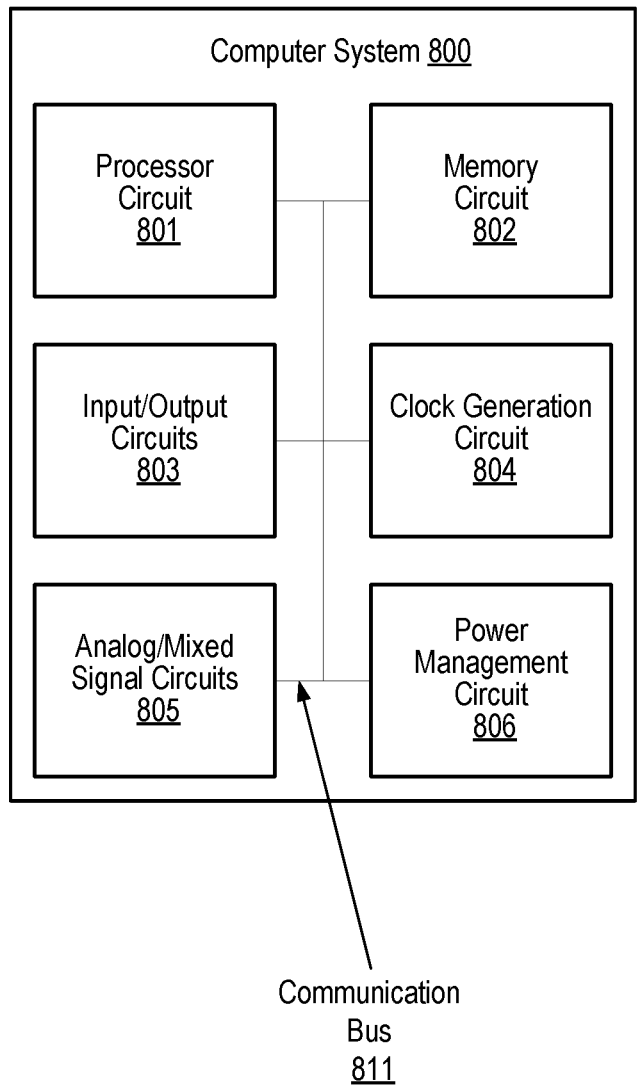
FIG. 8 shows a block diagram of an embodiment of a system-on-chip (SoC).

Mode select circuits and data storage circuits, such as those described above, may be used in a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of computer system 800 that includes the disclosed circuits is illustrated in FIG. 8. In some embodiments, computer system 800 may provide an example of an integrated circuit that includes system 200 in FIG. 2. As shown, computer system 800 includes processor circuit 801, memory circuit 802, input/output circuits 803, clock generation circuit 804, analog/mixed-signal circuits 805, and power management circuit 806. These functional circuits are coupled to each other by communication bus 811.

In some embodiments, processor circuit 801 may, correspond to or include processor circuit 100. Processor circuit 801, in various embodiments, may be representative of a general-purpose processor that performs computational operations. For example, processor circuit 801 may be a central processing unit (CPU) such as a microprocessor, a microcontroller, an application-specific integrated circuit (ASIC), or a field-programmable gate array (FPGA). In some embodiments, processor circuit 801 may correspond to a special purpose processing core, such as a graphics processor, audio processor, or network processor, while in other embodiments, processor circuit 801 may correspond to a general-purpose processor configured and/or programmed to perform one such function. Processor circuit 801, in some embodiments, may correspond to a processor complex that includes a plurality of general and/or special purpose processor cores.

Memory circuit 802, in the illustrated embodiment, includes one or more memory circuits for storing instructions and data to be utilized within computer system 800 by processor circuit 801. In various embodiments, memory circuit 802 may include any suitable type of memory such as a dynamic random-access memory (DRAM), a static random-access memory (SRAM), a read-only memory (ROM), electrically erasable programmable read-only memory (EEPROM), or a non-volatile memory, for example. It is noted that in the embodiment of computer system 800, a single memory circuit is depicted. In other embodiments, any suitable number of memory circuits may be employed.

Input/output circuits 803 may be configured to coordinate data transfer between computer system 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 803 may be configured to implement a version of Universal Serial Bus (USB) protocol or IEEE 1394 (Firewire®) protocol.

Input/output circuits 803 may also be configured to coordinate data transfer between computer system 800 and one or more devices (e.g., other computing systems or integrated circuits) coupled to computer system 800 via a network. In one embodiment, input/output circuits 803 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 803 may be configured to implement multiple discrete network interface ports.

Clock generation circuit 804 may be configured to enable, configure and manage outputs of one or more clock sources. In various embodiments, the clock sources may be located in analog/mixed-signal circuits 805, within clock generation circuit 804, in other blocks with computer system 800, or come from a source external to computer system 800, coupled through one or more I/O pins. In some embodiments, clock generation circuit 804 may be capable of enabling and disabling (e.g., gating) a selected clock source before it is distributed throughout computer system 800. Clock generation circuit 804 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Power management circuit 806 may be configured to generate a regulated voltage level on a power supply signal for processor circuit 801, input/output circuits 803, and memory circuit 802. In various embodiments, power management circuit 806 may include one or more voltage regulator circuits, such as, e.g., a buck regulator circuit, configured to generate the regulated voltage level based on an external power supply (not shown). In some embodiments any suitable number of regulated voltage levels may be generated. Mode select circuit 230 may, in some embodiments, be included in power management circuit 806.

Analog/mixed-signal circuits 805 may include a variety of circuits including, for example, a crystal oscillator, PLL or FLL, and a digital-to-analog converter (DAC) (all not shown) configured to generated signals used by computer system 800. In some embodiments, analog/mixed-signal circuits 805 may also include radio frequency (RF) circuits that may be configured for operation with cellular telephone networks. Analog/mixed-signal circuits 805 may include one or more voltage regulators to supply one or more voltages to various functional blocks and circuits within those blocks It is noted that the embodiment illustrated in FIG. 8 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 9:
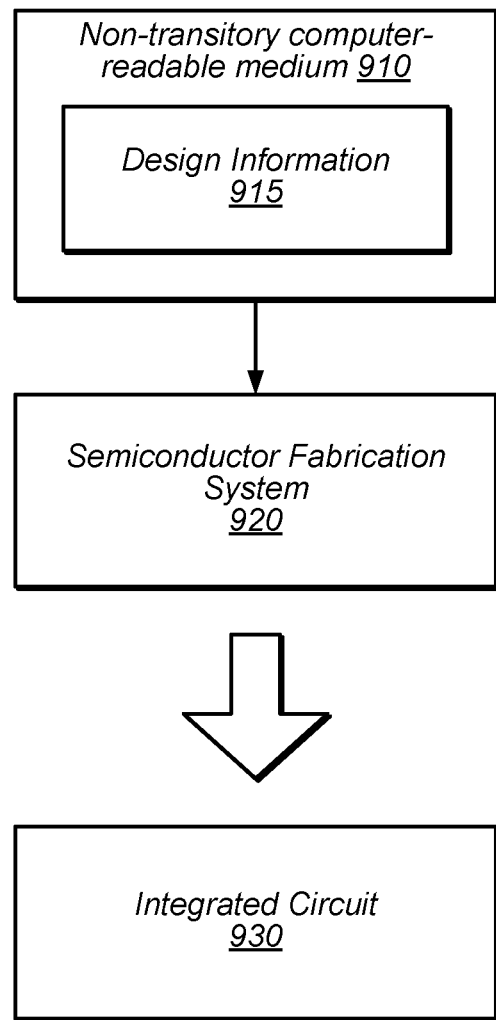
FIG. 9 is a block diagram depicting an example computer-readable medium.

FIG. 9 is a block diagram illustrating an example of a non-transitory computer-readable storage medium that stores circuit design information, according to some embodiments. The embodiment of FIG. 9 may be utilized in a process to design and manufacture integrated circuits, such as, for example, an IC that includes processor circuit 100 of FIG. 1 and system 200 of FIG. 2. In the illustrated embodiment, semiconductor fabrication system 920 is configured to process the design information 915 stored on non-transitory computer-readable storage medium 910 and fabricate integrated circuit 930 based on the design information 915.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums, which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 a control circuit configured to selectively activate, based on a current operating mode, a single one of a plurality of signals that are generated from a common clock signal, wherein the plurality of signals includes a local clock signal and a plurality of pulse signals, wherein the plurality of pulse signals includes at least a first pulse signal with a first pulse width, and a second pulse signal with a second pulse width, shorter than the first pulse width; and a data storage circuit coupled to a data signal, wherein the data storage circuit is configured to sample the data signal using the activated one of the plurality of signals.

2. The apparatus of claim 1, further comprising a mode select circuit configured to determine whether to activate a different operating mode of a plurality of operating modes.

3. The apparatus of claim 2, wherein the mode select circuit is further configured, in response to a determination to select a different operating mode, to:

disable the common clock signal;

selectively activate a different signal of the plurality of signals; and enable the common clock signal after the different signal has been activated.

4. The apparatus of claim 2, wherein to determine whether to activate the different operating mode, the mode select circuit is further configured to use an indication of a current performance efficiency of a processor circuit to make the determination.

5. The apparatus of claim 2, wherein to select a particular one of the plurality of pulse signals, the mode select circuit is further configured to:

receive an indication of a voltage level of a power signal included in a processor;

select the first pulse signal for a first voltage level; and select the second pulse signal for a second voltage level that is higher than the first voltage level.

6. The apparatus of claim 1, wherein the control circuit is further configured to:

generate the local clock signal using rising and falling transitions of the common clock signal; and generate the plurality of pulse signals using a rising transition of the common clock signal; and wherein the data storage circuit includes:

a first circuit configured to sample the data signal when the local clock signal is activated; and a second circuit configured to sample the data signal when one of the plurality of pulse signals is activated.

7. The apparatus of claim 1, wherein a frequency of the common clock signal is lower while the local clock signal is enabled than while one of the plurality of pulse signals is enabled.

8. A method, comprising:

based on a current state of a plurality of mode signals, generating, by a control circuit of a processor circuit, a single one of a plurality of signals that includes a local clock signal, a first pulse signal with a first pulse width, or a second pulse signal with a second pulse width that is shorter than the first pulse width; and sampling, by a data storage circuit of the processor circuit, a data signal using the generated signal.

9. The method of claim 8, further comprising using a common clock signal to generate either the local clock signal, the first pulse signal, or the second pulse signal.

10. The method of claim 9, further comprising changing, by a mode select circuit, a state of one or more of the plurality of mode signals by:

disabling the common clock signal;

changing the state of the one or more of the plurality of mode signals; and enabling the common clock signal in response to the changing of the state.

11. The method of claim 10, wherein changing the state of the one or more of the plurality of mode signals includes:

receiving, by the mode select circuit, an indication of a current performance efficiency of the processor circuit; and determining whether to change the state of the one or more of the plurality of mode signals using the indication.

12. The method of claim 9, wherein generating the local clock signal includes using rising and falling transitions of the common clock signal;

wherein generating the first and second pulse signals includes using rising transitions of the common clock signal; and wherein sampling the data signal includes:

using, by the data sampling circuit, a first circuit to sample the data signal when the local clock signal is activated; and using, by the data sampling circuit, a second circuit to sample the data signal when the first pulse signal is activated.

13. The method of claim 8, further comprising:

selecting the first pulse signal in response to a voltage level of a power signal included in a processor satisfying a first threshold level; and selecting the second pulse signal in response to the voltage level of the power signal satisfying a second threshold level, greater than the first threshold level.

14. The method of claim 8, further comprising, storing, by a keeper circuit, a particular value based on the sampling of the data signal.

15. An apparatus, comprising:

a control circuit configured to:

receive a plurality of mode signals, the plurality of mode signals indicating a particular operating mode of a plurality of operating modes;

generate, based on the particular operating mode, a single one of a plurality of signals, the plurality of signals including a local clock signal, a first pulse signal with a first pulse width, and a second pulse signal with a second pulse width, shorter than the first pulse width;

a master latch circuit configured to sample a data signal using the local clock signal in response to operating in a first operating mode of the plurality of operating modes;

a pulse latch circuit configured to:

in response to operating in a second or third operating mode, sample the data signal using the first or the second pulse signal, respectively; and a keeper circuit configured to store a particular value based on a sampling of the data signal.

16. The apparatus of claim 15, wherein the control circuit is further configured to:

disable an output of the pulse latch circuit in response to operating in the first operating mode; and disable an output of the master latch circuit in response to operating in either of the second or the third operating modes.

17. The apparatus of claim 15, wherein the control circuit is further configured to generate the local clock signal, the first pulse signal, and the second pulse signal from a common clock signal.

18. The apparatus of claim 15, wherein the control circuit is further configured to generate the first pulse signal in response to a determination that a voltage level of a power signal included in a processor is below a particular threshold level, and to otherwise generate the second pulse signal.

19. The apparatus of claim 15, wherein the master latch circuit is further configured, in the first operating mode, to:
   sample a value of the data signal in response to a falling transition of the local clock signal; and
   latch the sampled value of the data signal in response to a rising transition of the local clock signal.

20. The apparatus of claim 15, wherein the pulse latch circuit is further configured, in the second operating mode, to generate a latch output value based on a voltage level of the sampled data signal between a rising transition of the first pulse signal and a subsequent falling transition of the first pulse signal.

* * * * *